United States Patent [19]

Tawada et al.

[11] Patent Number: 4,476,346

[45] Date of Patent: Oct. 9, 1984

[54] PHOTOVOLTAIC DEVICE

[75] Inventors: Yoshihisa Tawada; Kazunori Tsuge, both of Kobe, Japan

[73] Assignee: Kanegafuchi Kagaku Kogyo Kabushiki Kaisha, Osaka, Japan

[21] Appl. No.: 465,016

[22] Filed: Feb. 8, 1983

[30] Foreign Application Priority Data

Dec. 14, 1982 [JP] Japan .................... 57-219862

[51] Int. Cl.$^3$ .............................. H01L 31/06
[52] U.S. Cl. ............................... 136/249; 136/258; 136/259; 357/2; 357/30
[58] Field of Search ............ 136/249 TJ, 258 AM, 136/259; 357/2, 30

[56] References Cited

U.S. PATENT DOCUMENTS

| 4,271,328 | 6/1981 | Hamakawa et al. | 136/249 TJ |
|---|---|---|---|
| 4,272,641 | 6/1981 | Hanak | 136/249 TJ |
| 4,388,482 | 6/1983 | Hamakawa et al. | 136/258 AM |

FOREIGN PATENT DOCUMENTS 55-108780  8/1980  Japan .................... 136/259

OTHER PUBLICATIONS

Applied Physics Letters, Aug. 1, 1981, vol. 39, No. 3, pp. 237–239.

Primary Examiner—Aaron Weisstuch
Attorney, Agent, or Firm—Armstrong, Nikaido, Marmelstein & Kubovcik

[57] ABSTRACT

A PIN junction photovoltaic device using a P-type or N-type semiconductor having an optical band gap of not less than about 1.8 eV and a dark conductivity of not less than about $10^{-8}$ $(\Omega \cdot cm)^{-1}$ at 20° C. in the layer positioned on the side opposite to incidence of light. The photovoltaic device has an improved efficiency.

13 Claims, No Drawings

PHOTOVOLTAIC DEVICE

BACKGROUND OF THE INVENTION

The present invention relates to a photovoltaic device having a high efficiency.

Since it was found in 1976 by W. E. Spear et al that the conductivity of amorphous silicon obtained by plasma decomposition of silane ($SiH_4$) could be greatly altered by doping with phosphine ($PH_3$) or diborane ($B_2H_6$) and an amorphous silicon solar cell was fabricated on an experimental basis in 1976 by D. E. Carlson et al, the amorphous silicon thin film solar cell has attracted attention and a lively study of improvement in its efficiency has been made.

A PIN junction amorphous silicon solar cell has the disadvantages that the P or N type amorphous silicon has a short carrier lifetime and, therefore, fails to provide effective carriers, and also the P-layer suffers from large absorption loss of light because it has a higher light absorption coefficient and more non-radiative recombination centers than the I-layer.

In order to eliminate these disadvantages, an inverted PIN junction photovoltaic device has been proposed. This photovoltaic device is constructed so that light impinges on the N-type amorphous silicon side. Since the N-type amorphous silicon has a smaller light absorption coefficient than the P-type, it is considered to be somewhat advantageous.

In order to greatly improve the disadvantages as mentioned above of the PIN junction amorphous silicon solar cell, a heterojunction solar cell using amorphous silicon carbide in the P-layer located on the light impinging side was proposed by Y. Tawada, H. Okamoto and Y. Hamakawa in *App. Phys. Lett.*, Vol. 39, pp 237-239 (1981). In this device, the light absorption loss due to the P-layer is greatly decreased by using amorphous silicon carbide, which has a large optical band gap, as a P-layer with valency controllability.

It is an object of the present invention to provide a PIN junction photovoltaic device.

A further object of the invention is to provide a photovoltaic device capable of more efficiently converting incident light energy into photo-current.

These and other objects of the present invention will become apparent from the description hereinafter.

SUMMARY OF THE INVENTION

It has now been found that the photo-current can be further increased by using as a P or N layer positioned on the side opposite to the incidence of light a semiconductor having an optical band gap of not less than about 1.8 eV and a dark conductivity of not less than about $10^{-8}$ $(\Omega \cdot cm)^{-1}$ at 20° C.

In accordance with the present invention, there is provided a PIN junction photovoltaic device having the construction electrode/PIN/electrode, the photovoltaic device being improved in that the P or N layer positioned on the side opposite to the incidence of light is a semiconductor having an optical band gap of not less than about 1.8 eV and a dark conductivity of not less than about $10^{-8}$ $(\Omega \cdot cm)^{-1}$ at 20° C.

DETAILED DESCRIPTION

The photovoltaic device of the present invention has a PIN junction as a basic structure, and is constituted of photoelectrically active amorphous semiconductors or amorphous semiconductors containing a crystalline phase.

These semiconductors are obtained by subjecting a mixture of gaseous or gasified compounds which are suitably selected from C, N, O, S, H, halogens, Si, Ge, and Sn to glow discharge decomposition. The semiconductors are also obtained by sputtering, employing as a target a mixture of solid compounds which are suitably selected from C, N, O, S, H, halogens, Si, Ge, and Sn, or by sputtering Si, Ge, Sn or a mixture of these elements as targets in a mixed gas suitably selected from C, N, O, S, H and halogens. In the above-mentioned glow discharge decomposition and sputter methods, the temperature of the substrate is not particularly limited, but in general is selected to be within 150° to 450° C.

In the present invention, it is desirable that the semiconductor contains at least 50 atom % of Si. More preferably, the total content of all elements selected from the group consisting of C, N, O and S in the semiconductor is at most 30 atom %. More preferably, the total amount of H and halogens contained in the semiconductor is from about 1 to about 40 atom %. Fluorine is the most preferable element among the halogens. It is more preferable that the element(s) used in the I-layer is(are) at least one member selected from Si, Ge, Sn and a compound of a hydrocarbon and a carbon fluoride. For instance, non-doped amorphous silicon (a—Si), non-doped amorphous silicon germanium (a—SiGe) and non-doped amorphous silicon tin (a—SiSn) are employed as the I-layer of the photovoltaic device.

The doping is carried out by adding, upon film formation, a compound of an element of Group III of the Periodic Table such as $B_2H_6$, or a compound of an element of Group V of the Periodic Table such as $PH_3$ to the compounds to be subjected to glow discharge decomposition or sputtering, or by using an ion-implantation after the film formation. The amount of dopant is selected so that the doped layer has a dark conductivity of not less than $10^{-8}$ $(\Omega \cdot cm)^{-1}$ and the diffusion potential as exhibited in the PIN junction is of a desired value.

In the present invention, it is necessary that the P or N layer positioned on the opposite side to the light impinging side has an optical band gap (Eg.opt) of not less than about 1.8 eV and a dark conductivity of not less than about $10^{-8}$ $(\Omega \cdot cm)^{-1}$ at 20° C. The thickness of such a P or N layer is from 50 to 300 angstroms, preferably 50 to 200 angstroms. For instance, amorphous silicon carbide [a—$Si_{(1-x)}C_x$], amorphous silicon nitride [a—$Si_{(1-x)}N_x$], amorphous silicon carbon nitride [a—$Si_{(1-x-y)}C_xN_y$], amorphous silicon oxide [a—$Si_{(1-x)}O_x$] and amorphous silicon oxide nitride [a—$Si_{(1-x-y)}O_xN_y$], the dangling bonds of which are terminated by H or F, or such semiconductors partially containing a microcrystalline phase are employed as a P or N layer to be provided on the opposite side to incidence of light.

The effects of the present invention are further increased when a metal having a reflectivity of not less than 70% is employed as a back side electrode, namely an electrode provided on the side opposite to incidence of light, e.g. Ag, Ti—Ag, Al, Ni, and Cr. Among them, Ag, Ti—Ag and Al are particularly preferred. In order to prevent reaction between such a metal as an electrode and the semiconductor layer, a metal oxide, preferably a metal oxide having light transmission of not less than about 80% may be interposed between the metal electrode and the semiconductor layer. In case of using an insulating metal oxide such as $TiO_x$, $NbO_x$ and $SiO_x$, the thickness of the metal oxide layer is selected from 10 to 200 angstroms, preferably 10 to 100 angstroms. In the case of a conductive metal oxide such as $SnO_2$, $In_2O_3$, ITO (indium-tin-oxide) ($In_2O_3+SnO_2$), it is employed in a thickness not causing loss of light. A combination of at least two layers of $SnO_2$, $In_2O_3$ and ITO can also be employed. The effects of the invention can be further increased by making the surface of the back side electrode rough. A metal foil having a rough surface or a metal foil which is coated with a heat resistant resin or an inorganic insulator layer and metallized to provide a lower electrode may be employed as a substrate.

The effects of the present invention are remarkable when an NIP type photovoltaic device is fabricated by using amorphous silicon as the I-layer. In that case, since light is irradiated from the N-layer side, an amorphous semiconductor or microcrystalline phase-containing amorphous semiconductor which has an optical band gap of not less than about 1.8 eV and a dark conductivity of not less than about $10^{-8}$ $(\Omega\cdot cm)^{-1}$ at 20° C., is employed as the P-layer. Amorphous silicon, amorphous silicon containing a microcrystalline phase, a—$Si_{(1-x)}C_x$, a—$Si_{(1-x-y)}C_xN_y$, a—$Si_{(1-x)}N_x$, a—$Si_{(1-x)}O_x$ and a—$Si_{(1-x-y)}O_xN_y$ are employed as the N-layer.

There is known a photovoltaic device having a multi-layer structure in which units of PIN structure are repeatedly arranged. In that case, an increase of the photo-current can be expected by decreasing the light absorption loss of the P or N layer and increasing the amount of light incident upon the I-layer of the adjacent PIN unit. In such a structure, the effects of the present invention are also exhibited. The photovoltaic device of the present invention may have a stacked multi-layer structure (e.g. PINPIN, PINPINPIN, etc.) where a plurality of PIN units each consisting of P, I and N layers are repeatedly provided. In that case, it is necessary that the photo-current generated in the respective PIN units are the same, and in the case of utilizing light of wide spectral range, it is effective to provide the PIN units so that the energies of the light absorbed in the respective I-layers decrease in order from the light incident side. Therefore, when the optical band gaps of the respective I-layers decrease in order from the light incident side, the photo-current is further increased, thus resulting in an increase of the effects of the invention. In that case, it is preferable that the optical band gap of the P or N layer positioned on the side opposite to light incidence of each PIN unit be larger than the optical band gap of the I-layer of the adjacent lower PIN unit, and further, it is preferable that the P or N layer on the light incident side of each PIN unit have a larger optical band gap than that of the I-layer of that unit.

Also, in the present invention, the P or N layer positioned on the light incident side may be a semiconductor having a dark conductivity of not less than about $10^{-8}$ $(\Omega\cdot cm)^{-1}$ at 20° C. and an optical band gap of not less than about 1.85 eV.

According to the present invention, the short-circuit current is increased by 10 to 20%. When Ag is used as the back side electrode, the short-circuit current is further increased by 10 to 15%. The effects of the invention will be explained by means of concrete examples.

Example 1 is a photovoltaic device having the construction: ITO/N-type μc—Si/I-type a—Si/P-type a—SiC/Al in which the P-type a—SiC is a semiconductor prepared by glow discharge decomposition of silane and methane and having an optical band gap (Eg·opt) of 2.0 eV and a dark conductivity ($\sigma d$) of $10^{-6}$ $(\Omega\cdot cm)^{-1}$. A photovoltaic device having the same construction as Example 1 except that P-type a—Si (doping ratio: 1% $B_2H_6$) is used as the P-layer is shown as a Comparative Example.

The photovoltaic device of Example 1 was fabricated as follows: Glow discharge decomposition was carried out at a ratio-frequency of 13.56 MHz by employing a diode coupled type rf glow discharge apparatus having electrodes of 300 mm. in diameter. A polished stainless steel plate was used as a substrate, and it was kept at 250° C. Aluminum was deposited on the substrate to provide an electrode. A P-type a—SiC:H layer having an optical band gap of 2.0 eV and a dark conductivity of $10^{-6}$ $(\Omega\cdot cm)^{-1}$ was deposited in a thickness of about 150 angstroms on the aluminum substrate by glow discharge decomposition of a mixture of 5 cc/min. of $SiH_4$, 5 cc/min. of $CH_4$ and 50 cc/min. of $H_2$ containing 500 p.p.m. of $B_2H_6$. The gas was then replaced, and an intrinsic a—Si:H layer was deposited in a thickness of 5,000 angstroms by glow discharge decomposition of a mixture of 7 cc/min. of $SiH_4$ and 60 cc/min. of $H_2$, and an N-type μc—Si layer containing microcrystals was further deposited in a thickness of about 100 angstroms by glow discharge decomposition at a high power in a mixture of 5 cc/min. of $SiH_4$ and 50 cc/min. of $H_2$ containing 500 p.p.m. of $PH_3$. After cooling and removal from the apparatus, an ITO layer having a thickness of about 650 angstroms was formed on the N-layer at 220° C. by electron beam deposition.

The photovoltaic device in the Comparative Example was prepared in the same manner as above except that a P-type a—Si:H layer having a thickness of 150 angstrom and having an optical band gap of 1.6 eV and a dark conductivity of $10^{-6}$ $(\Omega\cdot cm)^{-1}$ was formed by glow discharge decomposition in a mixture of 5 cc/min. of $SiH_4$ and 50 cc/min. of $H_2$ containing 500 p.p.m. of $B_2H_6$.

The I-V characteristics of the obtained photovoltaic devices were measured by an AM-1 solar simulator made by Ushio Electric Industry Co., Ltd. under a solar illumination power of 100 mW/cm². The results are shown in the following table.

|  | Jsc (mA/cm²) | Voc (V) | FF (%) | η (%) |
|---|---|---|---|---|
| Ex. 1 | 14.5 | 0.90 | 65 | 8.5 |
| Com. Ex. | 13.0 | 0.86 | 63 | 7.0 |

(Notes)
Jsc: short-circuit current
Voc: open-circuit voltage
FF: curve fill factor
η: conversion efficiency The following Example 2 shows a photovoltaic device having the same construction as Example 1 except that a Ag-deposited substrate is used as the back side electrode, and the following Example 3 shows a photovoltaic device having the same construction as Example 1 except that a Ag-deposited substrate having a rough surface is used as the back side electrode.

|  | Jsc (mA/cm²) | Voc (V) | FF (%) | η (%) |
|---|---|---|---|---|
| Ex. 2 | 15.7 | 0.90 | 65 | 9.2 |
| Ex. 3 | 16.5 | 0.90 | 65 | 9.7 |

From the above results, it is understood that the present invention has an excellent effect.

What we claim is:

1. In a PIN junction photovoltaic device having a construction: electrode/PIN/electrode, said photovoltaic device being improved in that one of the electrodes is transparent and only the P or N layer positioned on the side opposite to incidence of light and on the side of the I-layer opposite the transparent electrode is a semiconductor having an optical band gap of not less than about 1.8 eV and a dark conductivity of not less than about $10^{-8}$ $(\Omega \cdot cm)^{-1}$ at 20° C.

2. The photovoltaic device of claim 1, wherein the back side electrode positioned on the side opposite to incidence of light has a reflectivity of not less than 70%.

3. The photovoltaic device of claim 2, wherein said back side electrode is a metal selected from the group consisting of Ag, Al, Ti—Ag, Ni, and Cr.

4. The photovoltaic device of claim 2, wherein a metal oxide is interposed between the back side electrode and the semiconductor.

5. The photovoltaic device of claim 4, wherein said metal oxide has a light transmission of not less than about 80%.

6. The photovoltaic device of claim 4, wherein said metal oxide is a layer of a conductive metal oxide selected from the group consisting of $SnO_2$, $In_2O_3$, indium-tin-oxide, or a combination of at least two said layers.

7. The photovoltaic device of claim 4, wherein said metal oxide is an insulating metal oxide having a thickness of 10 to 100 angstroms.

8. The photovoltaic device of claim 1, wherein the I-layer is an amorphous semiconductor made of a main element selected from the group consisting of Si, Ge, and Sn or an amorphous semiconductor made of at least two elements selected from the group Si, Ge, Sn, C, N, and O.

9. The photovoltaic device of claim 8, wherein said I-layer is prepared by glow discharge decomposition of a mixture of a compound selected from the group consisting of a Si compound, a Ge compound and a Sn compound, and a compound selected from the group consisting of a hydrocarbon and a carbon fluoride.

10. The photovoltaic device of claim 1, having a stacked multi-layer structure where a plurality of PIN units each consisting of P, I and N layers are repeatedly provided.

11. The photovoltaic device of claim 10, wherein the optical band gaps of the respective I-layers decrease in order from the light incident side.

12. The photovoltaic device of claim 1, wherein the P or N layer positioned on the side opposite to incidence of light is an amorphous semiconductor or amorphous semiconductor containing a microcrystalline phase selected from a—SiC:H, a—SiC:F:H, a—SiCN:H, a—SiCN:F:H, a—SiN:H, a—SiN:F:H, a—SiO:H, a—SiO:F:H, a—SiON:H, and a—SiON:F:H.

13. The photovoltaic device of claim 12, wherein the I-layer is a—Si:H or a—Si:F:H.

* * * * *